(12) United States Patent
Stubbs et al.

(10) Patent No.: US 6,791,381 B2
(45) Date of Patent: Sep. 14, 2004

(54) METHOD AND APPARATUS FOR REDUCING THE LOCK TIME OF A DLL

(75) Inventors: Eric T. Stubbs, Boise, ID (US); James E. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 410 days.

(21) Appl. No.: 10/050,986

(22) Filed: Jan. 18, 2002

(65) Prior Publication Data

US 2002/0057119 A1 May 16, 2002

Related U.S. Application Data

(62) Division of application No. 09/649,192, filed on Aug. 28, 2000, now Pat. No. 6,388,480.
(60) Provisional application No. 60/151,446, filed on Aug. 30, 1999.

(51) Int. Cl.[7] .................................................. H03L 7/06
(52) U.S. Cl. ....................... 327/156; 327/159; 327/161; 327/263; 327/276; 331/17
(58) Field of Search ................................. 327/156–159, 327/161, 163, 263, 264, 276, 277, 284; 377/69, 72, 78; 331/17, 25

(56) References Cited

U.S. PATENT DOCUMENTS

| | | | | | |
|---|---|---|---|---|---|
| 5,124,669 | A | * | 6/1992 | Palmer et al. | 331/1 A |
| 5,223,755 | A | * | 6/1993 | Richley | 327/158 |
| 5,787,096 | A | * | 7/1998 | Roberts et al. | 714/718 |
| 5,920,518 | A | * | 7/1999 | Harrison et al. | 365/233 |
| 5,946,244 | A | * | 8/1999 | Manning | 365/194 |
| 6,069,506 | A | * | 5/2000 | Miller et al. | 327/156 |
| 6,194,930 | B1 | * | 2/2001 | Matsuzaki et al. | 327/156 |

* cited by examiner

*Primary Examiner*—Timothy P. Callahan
*Assistant Examiner*—An T. Luu
(74) *Attorney, Agent, or Firm*—Leffert Jay & Polglaze, P.A.; Daniel J. Polglaze (57) ABSTRACT

A delay locked loop having improved synchronization times has a variably adjustable delay line which accepts two incoming clock pulses. As each pulse propagates through the delay line an edge of the pulse toggles or retoggles a shift bit corresponding to a delay element. When the first pulse reaches the end of the delay line, the status of the shift bits is frozen, and a starting point for a synchronization sequence begins at the transition point between toggled and retoggled shift bits.

26 Claims, 6 Drawing Sheets

METHOD AND APPARATUS FOR REDUCING THE LOCK TIME OF A DLL

CROSS REFERENCE TO RELATED APPLICATIONS

This application is a divisional of U.S. Ser. No. 09/649,192, filed Aug. 28, 2000 now U.S. Pat. No. 6,388,480. This application is also related to and claims the benefit of the filing date of U.S. Provisional Application Ser. No. 60/151,446 (the '446 Application), filed on Aug. 30, 1999. The '446 Application is incorporated by reference.

BACKGROUND

The present invention relates generally to the generation of periodic signals, and more particularly to delay locked loop circuits (DLLs) having reduced signal lock time, and to integrated circuit memories including such DLLs.

Many high speed electronic systems possess critical timing requirements which dictate the need to generate a periodic clock waveform that possesses a precise time relationship with respect to some reference signal. The improving performance of computing integrated circuits (ICs) and the growing trend to include multiple computing devices on the same board present challenges with respect to synchronizing the timing of all the components.

While the operation of all components in a system should be highly synchronized (i.e., the maximum skew or difference in time between the significant edges of the internally generated clocks of all the components should be minute), it is not enough to feed the reference clock of the system to all the components. This is because different chips may have different manufacturing parameters which, when taken together with additional factors such as ambient temperature, voltage, and processing variations, may lead to large differences in the phases of the respective chip generated clocks.

Conventionally, synchronization, that is forcing an on-chip clock signal to match an external clock signal, or forcing two clock signals from different functional blocks of a circuit to be aligned, is achieved by using phase locked loops (PLL) or delay locked loop (DLL) circuits to detect the phase difference between clock signals of the same frequency and to produce a signal related to the phase difference between the signals. By feeding back the phase-difference-related signal to control an adjustable delay chain, the timing of one clock signal is advanced or delayed until its rising edge is coincident with the rising edge of a second clock signal. Analog delay locked loops introduce analog design considerations into digital circuits, and are therefore less than desirable in digital circuits. Digital delay locked loops use an adjustable delay chain. Digital information is used to either include or exclude a certain number of delay elements within a delay chain. Oscillator noise is not a factor in a DLL, and jitter is reduced. However, any ripple on the output of the loop filter will cause jitter.

Figure 1:
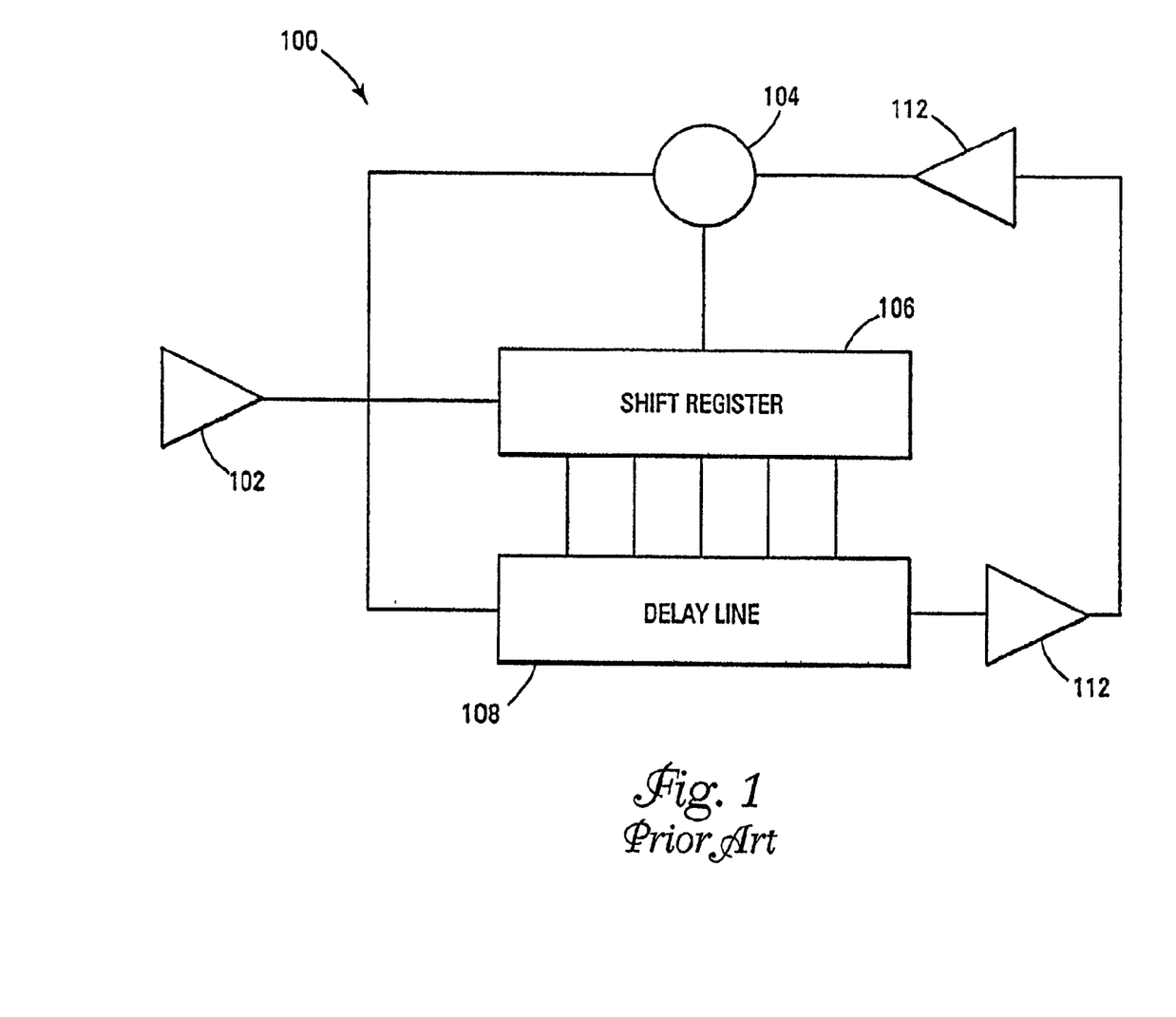
FIG. 1 is a block diagram view of a prior art delay locked loop.

In a conventional delay locked loop (DLL), a clock input buffer accepts a clock input signal and transmits the signal to one or more delay chains, as shown in FIG. 1. The delay of the delay path is increased from a minimum setting until the edge of the delayed reference clock is eventually time-shifted just past the next corresponding edge of the reference clock. A digital phase detection circuit is employed to control the delay line propagation delay so that the delayed clock remains synchronized with reference clock A diagram of a typical digital DLL 100 is illustrated in FIG. 1. An input clock signal, CLK IN, is received via a buffer 102. The buffer 102 provides a buffered clock signal to delay line 108 and phase detector 104, and is coupled as well to shift register 106. The end of the delay line 108 is coupled to buffer 110 through which an output clock signal is produced. The output clock signal is buffered through a buffer 112 to produce a feedback clock signal which is provided to the phase detector 104. In operation, the phase detector 104 determines if a phase difference exists between the buffered input and feedback clock signals. The phase difference determines an appropriate shift in the buffered input clock signal via adjustment of shift bits in the shift register 106 to select sufficient delay in the delay line 108.

Multiple delay chains may be used in further prior art configurations. In such configurations, a second delay chain is connected to dummy circuitry, including a dummy clock buffer and load capacitance, that matches the delay of the internal clock path of the actual circuit. Such circuitry includes a divider which divides down the external clock signal to produce a divided down external signal. A second signal is the signal at the output of dummy delay chain. A third signal generated inside phase comparator is a one-delay-unit-delayed signal. If the second and third signals each go high before the divided down external signal goes low, the output clock is too fast. The phase comparator outputs a shift left (SL) command to the shift register. The shift register then shifts the tap point of the delay chains by one step to the left, increasing the delay. Conversely, if both the second and the third signals go high after the divided down clock signal goes low, the output clock is too slow, and the phase comparator outputs a shift right (SR) command to the shift register. The shift register then shifts the tap point of the delay chains by one step to the right, decreasing the delay. If the divided down clock signal goes low between the time the second and third signals go high, the internal cycle time is properly adjusted and no shift command is generated. The output of the internal clock path in this case coincides with the rising edge of the external clock and is independent of external factors such as ambient temperature and processing parameters.

Conventional DLLs suffer from numerous drawbacks. One such drawback occurs in the event of power-up of the DLL or after a pause in the input driving the DLL. In a conventional DLL, the logic is randomly initialized to unknown values at power-up or after a pause. This problem is typically resolved in conventional DLLs by using initialization circuitry to power-up the DLL at some predetermined value. The predetermined value most often used is to set the shift bits of the delay chain of the DLL to binary zeros ("0"s). A delay chain of 0s in the DLL is a minimum delay setting. The initial lock sequence then proceeds through the delay chain, one element at a time, until a lock is achieved. Using this conventional locking scheme, a DLL with a delay chain of, for example, 100 elements could require as many as 100 cycles to achieve a lock. An optimum predetermined setting of half 1s and half 0s could be used. However, depending on the length of the delay chain of DLL, such a setting could still require a large number of cycles, up to 50, before a lock is achieved.

Another drawback of many conventional DLLs is that they are inherently inaccurate. This inaccuracy is due to the fact that they compare a divided down version of the input clock signal, rather than the actual input clock signal, with the output clock signal.

There is a need, therefore, to improve the performance of DLLs by reducing the number of cycles required to achieve a lock after power-up or a pause in input cycles.

SUMMARY

In one embodiment, a method of improving synchronization time in a delay locked loop (DLL) includes propagating a first input clock pulse through a delay line having a number of delay elements, and toggling a number of shift bits, each shift but corresponding to one of the delay elements, as an edge of the first input pulse passes each delay element. This embodiment further includes propagating a second input clock pulse through the delay line, and re-toggling a portion of the shift bits in response to an edge of the second pulse. The re-toggling is halted when the edge of the first pulse reaches an end of the delay line, DLL synchronization is started at a transition between toggled and re-toggled shift bits.

In another embodiment, a method for reducing lock time in a delay locked loop (DLL) includes measuring a length of an input clock period relative to a path length through the DLL, and estimating a starting point for a lock sequence based upon a phase difference between two consecutive clock pulses passed through the DLL.

In yet another embodiment, delay locked loop (DLL) includes a delay line having a number of delay elements and a corresponding number of shift bits in a shift bit register. Each shift bit is connected to one of the delay elements to toggle each shift bit on a rising edge of a clock signal. The DLL further includes delay line circuitry to pass two consecutive rising clock signal edges to the delay line, and edge detection circuitry at an output end of the delay line to halt toggling of the shift bits upon detection of the first edge at the output end of the delay line.

In still another embodiment, an integrated circuit includes first and second sub-circuits connected to synchronize to an external clock, and a delay locked loop (DLL) connected to synchronize the first and the second sub-circuits.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figure 2:
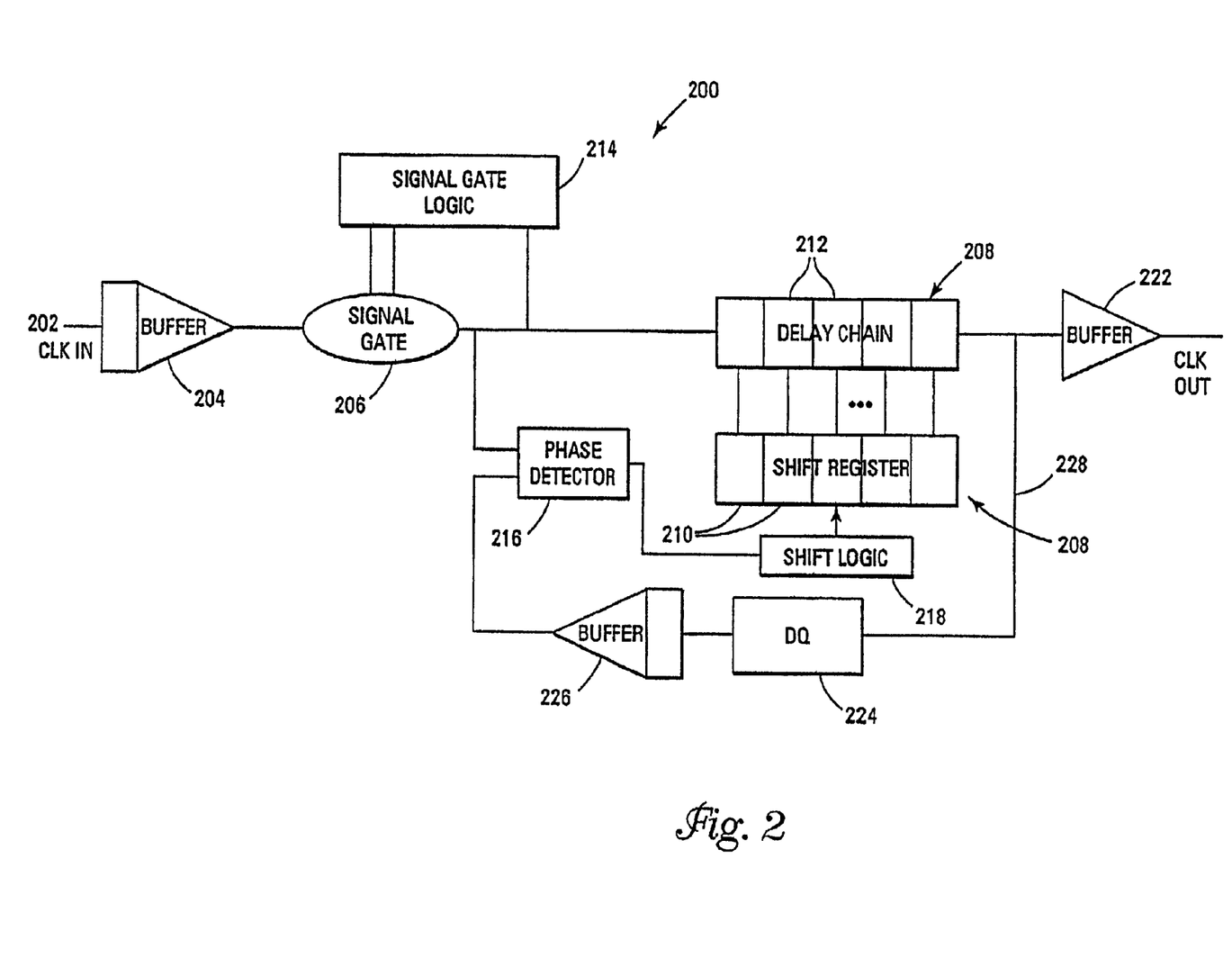
FIG. 2 is a block diagram of a DLL according to one embodiment of the present invention.

FIG. 2 is a block diagram of a digital delay locked loop according to one embodiment of the present invention. In this embodiment, the DLL 200 has an input (or reference) signal 202 (CLK IN) which is fed through an input buffer 204 and a signal gate 206 into an adjustable delay chain 208. The DLL has an output signal 222, CLK OUT, which can differ in phase with respect to CLK IN by a quantum of time, but which ideally should be in phase with CLK IN. A phase detector 216 compares the phases of the CLK IN and CLK OUT signals (in one embodiment, phase detector 216 operates to match the rising edge of signal CLK OUT to a rising edge of signal CLK IN) and generates a digital signal related to the difference in phase between the two signals.

This signal is fed to shift logic 218 to control shift register 220 as described in further detail below. In one embodiment, a fixed delay line 228 feeds the CLK OUT signal back to the phase detector 216 through a series of dummy circuits designed to emulate the internal clock path of the of the actual circuit. The fixed delay line 228 includes in one embodiment dummy circuits DQ model 224 and dummy clock buffer 226.

In one embodiment, phase detector 216 is a phase comparator. In this embodiment, the output of the phase detector 216 is a binary signal that is high if CLK OUT is ahead of the phase of CLK IN and low if CLK OUT is behind the phase of CLK IN. In another embodiment, the phase detector 216 is configured to generate a low output if CLK OUT is ahead of the phase of CLK IN and a high output if CLK OUT is behind the phase of CLK IN. The binary signal is representative of whether CLK OUT is delayed with respect to CLK IN, fast with respect to CLK IN, or in phase with respect to CLK IN. In either embodiment, no phase difference indicates that the CLK IN and CLK OUT signals are in phase, and no adjustment is necessary. Thus, this binary signal represents a shift left, shift right, or no signal, respectively, to be applied to shift register 220 for aligning the phases of CLK IN and CLK OUT.

Shift register 220 contains a plurality of shift bits 210 which can store a bit pattern wherein each shift bit carries a binary value of one (1) or zero (0). During initialization of the DLL 200, which occurs on circuit or device startup and also when the CLK signal has been temporarily lost or interrupted for some reason, each of the shift bits 210 is initialized to the same value, in this embodiment a one (1) indicating that each delay element 212 of the delay line 208 is operational. The signal gate logic 214 allows a first input pulse to begin propagating through the delay line 208. As the first clock pulse propagates through the adjustable delay chain 208, each shift bit 210 of each delay element 212 is toggled to a low (0) value as the pulse reaches each delay element 212.

When the signal gate 206 receives a second input clock pulse, the high edge of the second pulse is detected by the signal gate logic 214, and the second pulse is also allowed through the signal gate 206 to begin propagating through the delay chain 208. At this point, the signal gate logic 214 prevents further clock pulses from passing through the signal gate 206 to the delay line 208.

The high edge of the second pulse is allowed to propagate through the adjustable delay chain 208. As the second pulse edge propagates through the delay chain 208, each shift bit 210 of each delay element 212 that has previously been toggled from high (1) to low (0) is retoggled back to high (1) as the second pulse edge passes each delay element 212.

Once the high edge of the first pulse reaches phase detector 216, in one embodiment directly at the end of the delay line 208 and in another embodiment after reaching the end of the delay line 208 and passing through dummy circuit elements 224 and 226, shift register logic 218 is triggered to terminate all further retoggling of shift bits 240 in the shift register 220 due to the propagation of the second pulse through the delay line 208. The shift register 220 and its shift bits 210 are frozen in the state they were in when the first clock signal reaches the phase detector 216.

Once the status of the shift bits 210 and the shift register 220 is frozen, the shift register logic 218 looks at the status of each of the shift bits. In this embodiment, there will be a certain number of shift bits at the end of the delay line 208 which have been toggled from their initial value to the opposite binary value, in one embodiment from one to zero. There will also be a number of shift bits in the shift register at the beginning of the delay line which have not only been toggled from their initial value to the opposite value, but which have also been toggled back to their initial value.

The point of transition between shift bits 210 that have been toggled once by the first clock pulse and that have been toggled and retoggled by the first and the second clock pulses is the point in the delay line where shift register 220 sets the delay of the adjustable delay chain 208. The shift logic 218 signals a shift left or shift right, or no shift of the transition point in the shift register depending on the output of the phase detector 216. The bit value change is one bit to the right if CLK OUT is delayed with respect to CLK IN or one bit to the left if CLK OUT is ahead of CLK IN. If CLK IN and CLK OUT are in phase, there is no change in the bit value of shift register 220. A change in the bit value of shift register 220 to the left or to the right operates to regulate the delay of the adjustable delay chain 208 by shifting the tap point (delay element) which controls the amount of delay by one delay element 212 to the left or the right, respectively.

Thus, in an 80-bit shift register, the first one to zero transition in the shift bits 210 of the shift register 220 is indicative of the location of the tap point. The adjustable delay chain of this embodiment is designed to provide delays from the sub-nanosecond range to 20 nanoseconds or more. An 80-bit shift register is used in another embodiment to provide fine time slices in the adjustable delay chain, reducing jitter, although other values of the number of shift bits are implemented in other embodiments.

The initial value of the shift bits 210 in shift register 220 is set to all zero (0) in another embodiment. Toggling and retoggling operates the same way in this embodiment, but the one to zero transition for location of the tap point is a zero to one transition instead. Further, logic to set the delays then requires toggling of all the frozen shift bits again to enable delay elements 212 from the beginning of the delay line 208 instead of having the delays all on as in the earlier embodiment in which the initial value of the shift bits is one (1).

In another embodiment, the delay introduced by the adjustable delay chain 208 is augmented by a fixed delay introduced at the head or tail of the chain, or somewhere else in the circuit.

Figure 3:
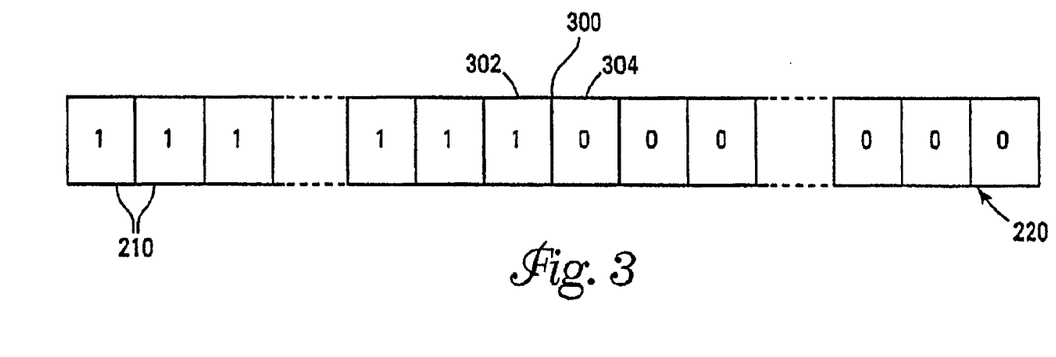
FIG. 3 is a sample state of shift bits in a shift register according to one embodiment of the present invention.

FIG. 3 depicts an example state of the shift bits 210 in the shift register 220 after the high edge of the first pulse is received by the phase detector 216. There is a point 300 in the delay chain between individual shift bits 302 and 304 at which all the shift bits 210 to the beginning side of the shift register have been toggled and retoggled twice (from 1 to 0 and back to 1 in one embodiment) and all the shift bits 210 on the ending side of the shift register 220 have been toggled only once (from 1 to 0 in one embodiment). This point 300 is the initial tap point for the adjustable delay chain 208. Point 300 represents the lock sequence starting point for the DLL. From this "estimated sync point," the DLL will be able to achieve a signal lock within a few delays or cycles.

Figure 4:
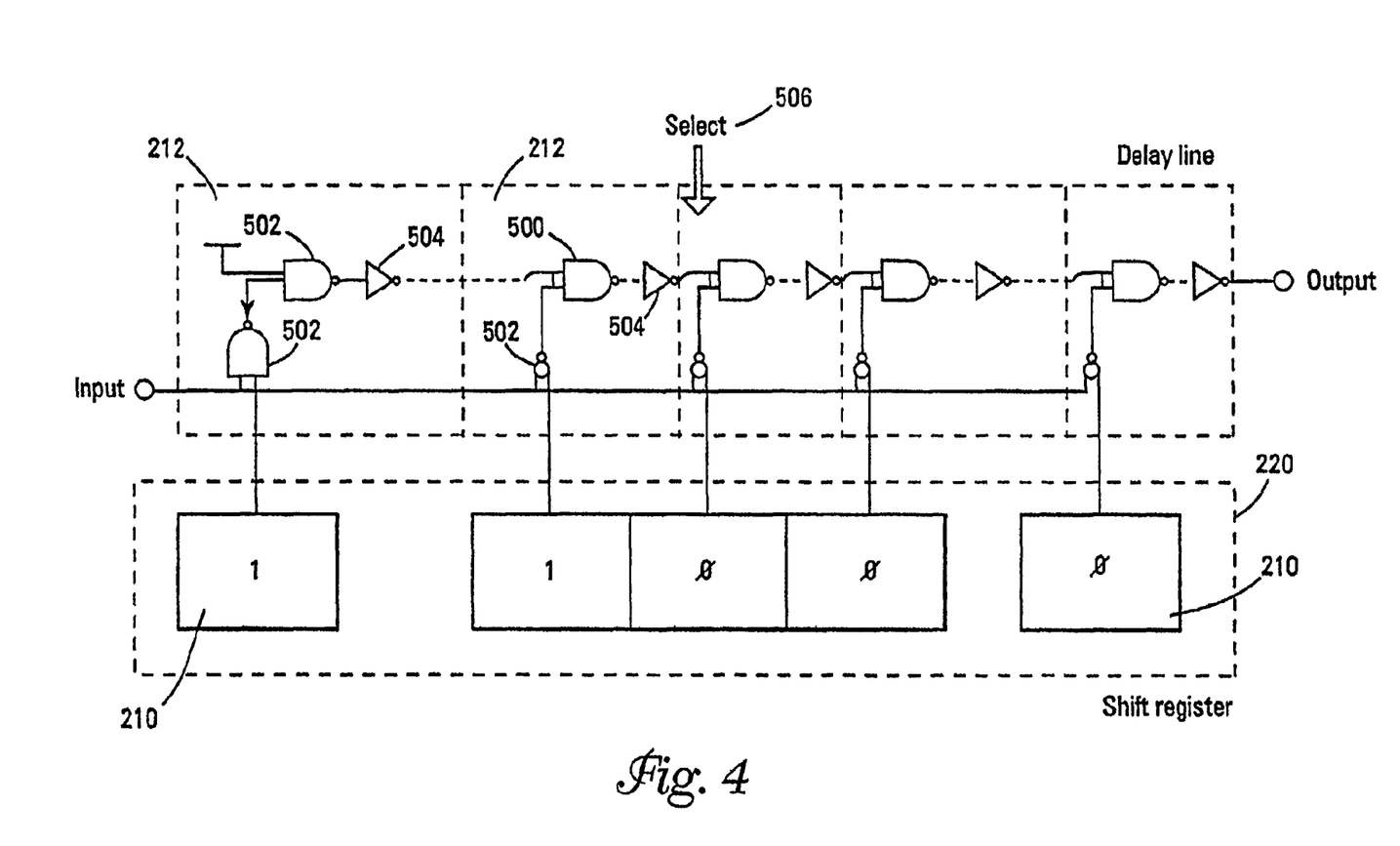
FIG. 4 is a circuit diagram of a delay chain and shift register according to one embodiment of the present invention.

FIG. 4 depicts one embodiment of the delay elements 212 forming the adjustable delay chain 208 of one embodiment of a DLL using the present invention. The delay chain 208 in this embodiment includes a series of connected delay elements 212. Each delay element 212 comprises in this embodiment two NAND gates 502 and an inverter 504. Input pulses are allowed to propagate through the delay chain 208 to a selected tap point 506, indicated by a low logic state in shift register 220. It should be understood that different delay elements as known in the art can be utilized with the present invention without departing from the scope thereof.

Figure 5:
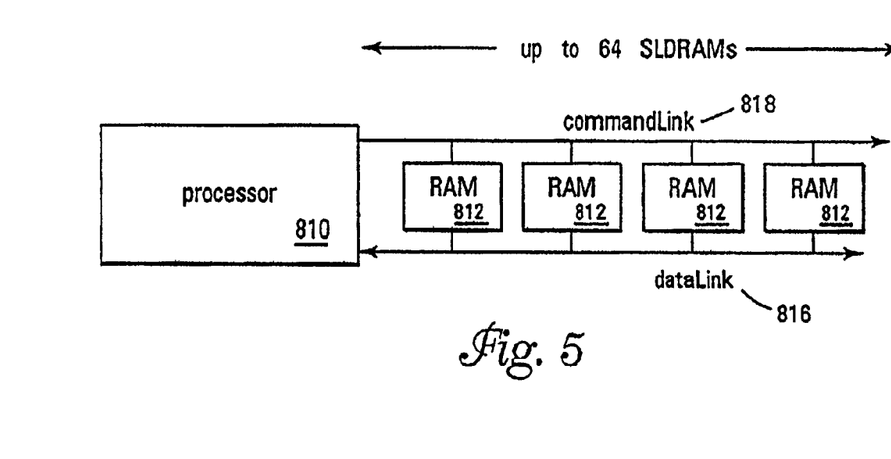
FIG. 5 is a block diagram of an SLDRAM memory system layout according to one embodiment of the present invention.

A sample implementation of the disclosed inventions in an advanced synchronous memory system is now described with reference to FIG. 5. The particular example described here is an SLDRAM, but the described synchronization functions are also expected to be useful in double data rate (DDR) SDRAM systems and/or in direct Rambus DRAM (DRDRAM) systems. Further, the embodiments of the present invention have broad applicability in all electronic computer systems employing more than one IC with an internal clock. The above description is intended to be illustrative, not restrictive.

Synclink DRAM (SLDRAM) is a high performance memory that uses a protocol based on event scheduling. Synclink implementation is intended to support bursts of 500 MHz and higher. It includes a specialized link controller, several SLDRAMs on one-way write and read buses and interconnects between the devices, as shown basically in FIG. 6. Two shared links (buses), a unidirectional command link 818, and a bi-directional data link 816 are used to connect a memory controller 810 to multiple slaves (typically, SLDRAM memory chips 812). This embodiment uses shared-link (bused) communication to achieve a simple high-bandwidth data-transfer path between a memory controller 810 and one or more memory slaves 812. The system consists of one controller and up to 64 SLDRAMs, as illustrated. Having only one controller on each subsystem dramatically simplifies the initialization and arbitration protocols.

The link from the controller to the nodes, the command link, is unidirectional, and the signal values can change every clock tick. The nominal clock period is physical-layer dependent (for a compact high-performance system, say 2.5 ns), but the system changes data values on both edges of the clock (i.e., the data signals may change every 1.25 ns). For a 10-bit wide command link, this example corresponds to raw bandwidth of 200 M command packets/s.

The basic command link contains fourteen signals: linkOn (a low-speed asynchronous initialization signal), a strobe (clock) signal, a listen signal that enables flag and data receivers, a flag signal, and ten data signals. The listen, flag, and data are source-synchronous in that the incoming strobe signal indicates when the other input signals are valid. The flag signal marks the beginning of transmitted packets.

The data signals are used to transmit bytes within packets. Depending on the location within a packet, the bytes provide address, command, status, or data values.

The data link is 16- or 18-bits wide, carrying read data from the nodes back to the controller or write data from the controller to one or more nodes. The bit rate is the same as for the command link, and the minimum block transferred corresponds to 4-bits on each data link pin, the same duration as the command. The timing assumptions for the 2.5 ns clock period assumed in the example above result in 1600 MBytes/s on the data link. The chips in this embodiment are connected by command and data links. The controller drives the command link to send read, write, load, store, and event commands to the SLDRAMs. The data link is driven by an SLDRAM and received by the controller during read and load transactions, or driven by the controller and received by an SLDRAM in the case of write transactions.

Figure 6:
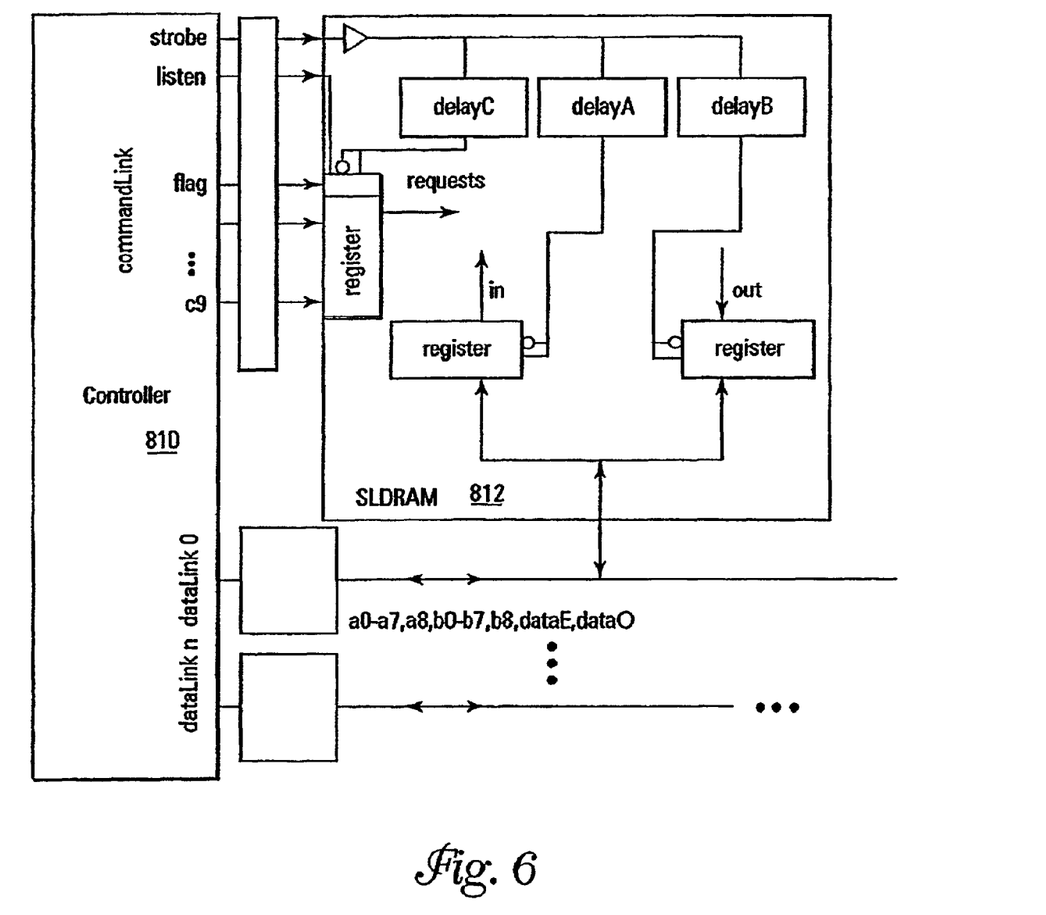
FIG. 6 is a block diagram of an SLDRAM synchronization design model according to one embodiment of the present invention.
Figure 7:
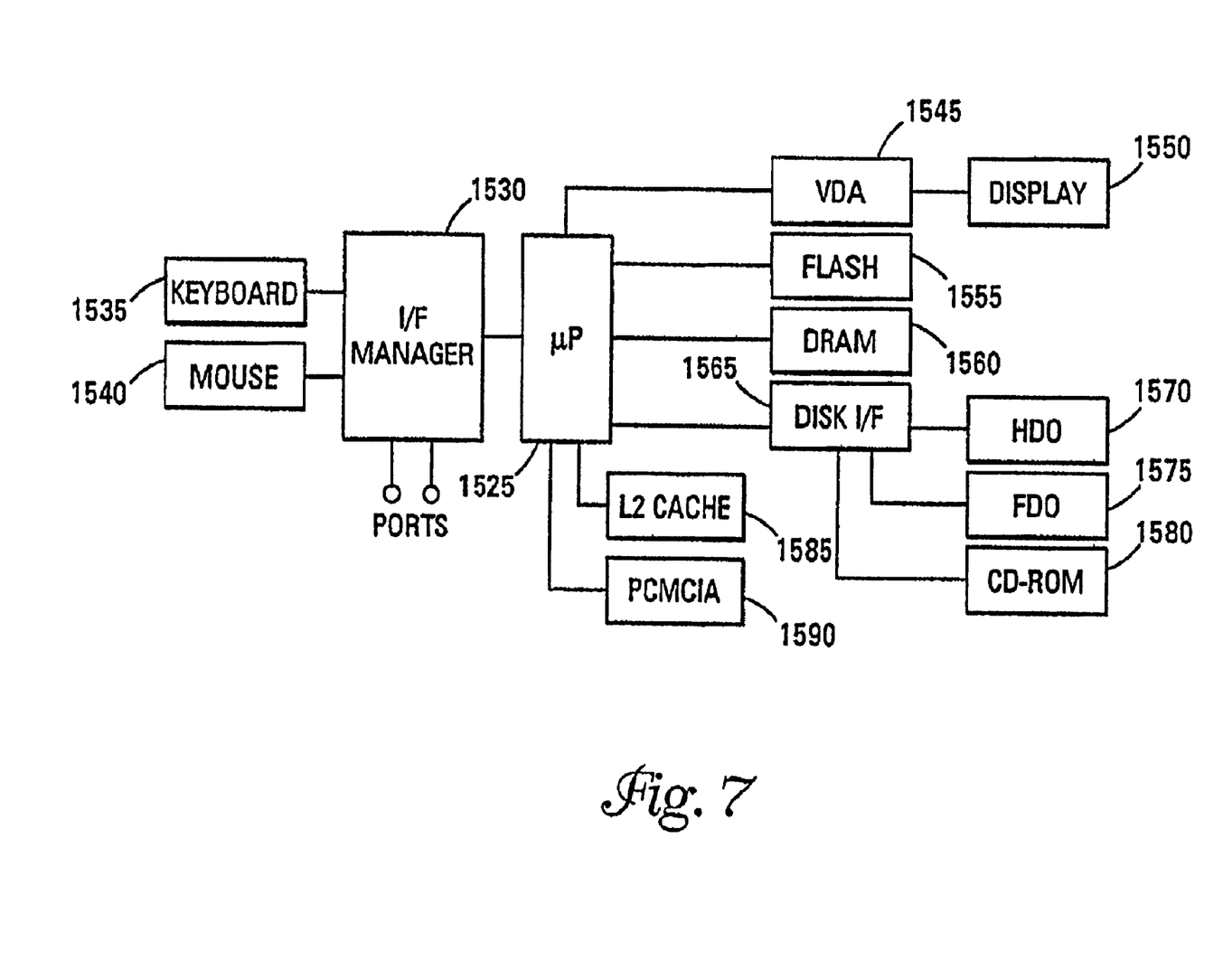
FIG. 7 is a block diagram of a computer system in which embodiments of the present invention are implemented.

FIG. 6 shows a simple design model for the timing control. Note that three delay elements are shown; namely, DelayA, DelayB, and DelayC. The DLL described above can be used advantageously for any or all of these delays. In order to sample the command link signals reliably, DelayC is adjusted by the SLDRAM itself (or be set statically by its design) so that the flag and data are sampled reliably during the stable period between their transitions. This sampling must work properly in order to send commands to the SLDRAMs, so it must be stable before initialization of the memory system can begin. The command link is sent to every SLDRAM, so its route is not generally the same as that of the data link, and in order to keep its loading approximately the same as that of the data link, it will have to be buffered by amplifiers. These buffers will be used on chip, as shown in FIG. 7, or alternatively can be used in an interface chip in multi-chip modules. The delay inserted by these buffer amplifiers may be different for each SLDRAM in a system, and it may be comparable to one clock period. Compensation for this unknown delay is therefore necessary.

To maintain synchronous signaling on the data link, SLDRAM chips have digitally controllable delay circuits (delayA and delayB) that determine precisely when the data link inputs are sampled and the data link outputs are driven. These delays compensate for clock buffering delays and differences between the command link path and the data link path. The value of delayA is set to ensure that the incoming signals are stable when their values are latched. The value of delayB compensates for delays in the output register so that transitions in the dataOut signals occur at the proper time. When the system powers up, internal feedback in the SLDRAM adjusts delayB to bring the chip outputs into approximate sync with strobe, but during operation, the internal sync feedback is disabled and the value of delayB is controlled by the controller chip, which sends store commands to set the timing directly or event commands to increase or decrease the chip output timing in small steps so that the signals are correctly timed at the controller inputs instead of at the chip output.

While SLDRAMs have been described above, the embodiments of the present invention are applicable in other memory devices, such as other synchronous memory devices or the like. For example, synchronous DRAM (SDRAM), which latches information from a processor in and out under control of a system clock, which must be synchronized to allow for good performance. In one embodiment, a memory device comprises a plurality of memory arrays addressed by row and column address decoders and a memory controller operable to control read and write operations of the memory arrays. In another embodiment, such a memory with synchronization circuitry operatively connected to the plurality of memory arrays to synchronize the incoming clock signal includes a delay locked loop such as DLL 200 described above.

FIG. 7 shows a block diagram of a computer system which includes DRAM memory. The complete computer system includes, in this example, user input devices (e.g., keyboard 1535 and mouse 1540), microprocessor 1525, which is operatively connected to receive inputs from the input devices through an interface manager chip 1530 (which also provides an interface to the various ports), flash memory 1555 and SLDRAM 1560, which are accessible by the microprocessor, display 1550 and display driver card 1545, which is connected to output data generated by microprocessor 1525, and a magnetic disk drive 1570, which is read-write accessible through an interface unit 1565 by the microprocessor.

The disclosed embodiments, among other advantages, provide faster lock time in DLLs by reducing the number of cycles required to achieve a lock, allow for integration into existing DLL circuitry by using existing delay chains, allow for fast propagation (with delay time around ⅓ to ¼ nanosecond per delay chain element), reduce die size impact by use of existing DLL circuitry, and reduce cost of production by utilizing existing DLL circuitry.

Conclusion

Following power-up or a pause in an input clock to a delay locked loop (DLL), a circuit is initialized that measures the length of the input clock period relative to a path length through the DLL. Upon initialization, this circuit enables an adjustable delay chain to its maximum delay length. All of the shift bits in a shift bit register operatively connected so that each shift bit corresponds to one delay element in the delay chain are initialized to the same value. A clock high edge is allowed to propagate through the delay chain, toggling the value of the respective shift bit at each delay. Once a second clock high edge is detected at the input to the delay path, the input to the path is disabled after that second edge enters the delay chain. The second clock edge propagates down the line, re-toggling the previously toggled shift bits, until the first clock edge reaches a phase detect circuit at the end of the delay line. When the first clock edge reaches the end of the delay line, further toggling of the shift bits is prevented.

After further toggling of the shift bits is prevented, there will be a point in the delay chain at which all shift bits to one side have been toggled once and those to the other side have been toggled twice. This is the starting point for the lock sequence of the DLL. Knowing where in the delay path to start the lock sequence allows the DLL to lock with the input clock within a few cycles, regardless of the clock cycle time, rather than beginning with a zero delay and incrementing through each element until a lock is achieved.

The signal gate logic of the earlier described embodiments terminates the initialization signal input after the high edge of the second pulse. However, the signal gate logic in other embodiments is designed to allow more or fewer pulses or pulse parts (edges) into the adjustable delay chain during initialization. In addition, the signal gate logic is designed in other embodiments to lock onto harmonics of the input signal in this manner.

The present application discloses methods and apparatuses for locking a digital delay locked loop (DLL) onto an input clock within a reduced number of cycles. An adjustable delay chain is used in the DLL. The timing difference between first and second pulses of an input signal is used to mark a "tap point" on the adjustable delay chain. The tap point is used to provide the lock sequence of the DLL with an initial delay value. Knowing where in the delay path to start the lock sequence will allow the DLL to lock with the input clock within a few cycles, regardless of the clock cycle time, rather than beginning with a zero delay (or other fixed delay) and incrementing through each delay element until a lock is achieved.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory device, comprising:
   a plurality of memory arrays addressed by row and column address decoders;
   a memory controller operable to control read and write operations of the memory arrays;
   synchronization circuitry operatively connected to the plurality of memory arrays to synchronize incoming clock signals, wherein the synchronization circuitry comprises a delay locked loop, the delay locked loop comprising:
      a delay line having a plurality of delay elements and a plurality of shift bits in a shift bit register, each shift bit operatively connected to one of the plurality of delay elements to toggle each shift bit on a rising edge of a clock signal;
      an input clock buffer to receive an input clock signal;
      a normally open signal gate connected to an output of the input clock buffer to detect a rising edge of a first clock signal and a second clock signal and to pass the first and the second rising edges to the delay line;
      a phase detector connected to an output of the delay line to detect the rising edge of the first clock signal; and
      shift bit logic connected between the phase detector and the shift bit register to prevent toggling of shift bits upon detection of the edge of the first clock signal at the output of the delay line.

2. The memory device of claim 1, and further comprising:
   shift logic for setting, the delay elements according to the shift bit status.

3. The memory device of claim 1, and further comprising:
   dummy circuitry interposed between the end of the delay line and the phase detector.

4. A memory device, comprising:
   a plurality of memory arrays addressed by row and column address decoders;
   a memory controller operable to control read and write operations of the memory arrays;
   synchronization circuitry operatively connected to the plurality of memory arrays to synchronize the incoming clock signal, wherein the synchronization circuitry comprises a delay locked loop, the delay locked loop comprising:
      a delay line having a plurality of delay elements and a plurality of shift bits in a shift bit register, each shift bit operatively connected to one of the plurality of delay elements to toggle each shift bit on detection of a rising edge of a clock signal; and
      delay line circuitry to pass two consecutive rising clock signal edges to the delay line; and
      edge detection circuitry at an output of the delay line to halt toggling of the shift bits upon detection of the first edge at the output of the delay line.

5. The memory device of claim 4, and further comprising:
   register address circuitry to determine a location in the shift register of a transition between shift bits having a binary one value and shift bits having a binary zero value.

6. The memory device of claim 5, and further comprising:
   clock synchronization circuitry to begin clock synchronization at the determined transition.

7. The memory device of claim 4, and further comprising:
   dummy circuitry interposed between the output of the delay line and the edge detection circuitry.

8. The memory device of claim 4, wherein the edge detection circuitry is a phase detector.

9. A memory device, comprising:
   a plurality of memory arrays addressed by row and column address decoders;
   a memory controller operable to control read and write operations of the memory arrays;
   synchronization circuitry operatively connected to the plurality of memory arrays to synchronize the incoming clock signal, wherein the synchronization circuitry comprises a delay locked loop, the delay locked loop comprising:
      an adjustable delay chain having a plurality of delays and a plurality of shift bits, each shift bit corresponding to one of the plurality of delays, each shift bit operable in a first state and a second state, wherein the states are toggled by a clock signal edge passing through its respective delay;
      an edge detection circuit connected to an input of the delay line to pass two clock edges to the delay line;
      a phase detector connected to an output of the delay line to detect when the first clock signal reaches the output of the delay line; and
      shift bit logic connected between the phase detector and the shift bits to halt the toggling of shift bits when the first clock signal reaches the output of the delay line.

10. A synchronous memory device, comprising:
    an array of memory cells addressable by a controller to control read and write operations to the memory cells; and
    synchronization circuitry operatively connected to the array of memory cells to synchronize incoming clock signals therebetween, wherein the synchronization circuitry comprises a delay locked loop, the delay locked loop comprising:
       a delay line having a plurality of delay elements and a plurality of shift bits in a shift bit register, each shift bit operatively connected to one of the plurality of delay elements to toggle each shift bit on detection of a rising edge of a clock signal;
       delay line circuitry to pass two consecutive rising clock signal edges to the delay line; and
       edge detection circuitry at an output of the delay line to halt toggling of the shift bits upon detection of the first edge at the output of the delay line.

11. The memory device of claim 10, and further comprising:
    register address circuitry to determine a location in the shift register of a transition between shift bits having a binary one value and shift bits having a binary zero value.

12. The memory device of claim 10, and further comprising:
    clock synchronization circuitry to begin clock synchronization at the determined transition.

13. The memory device of claim 10, and further comprising:
    dummy circuitry interposed between the output of the delay line and the edge detection circuitry.

14. The memory device of claim 10, wherein the edge detection circuitry is a phase detector.

15. A synchronous memory device, comprising:
an array of memory cells addressable by a controller to control read and write operations to the memory cells; and
synchronization circuitry operatively connected to the array of memory cells to synchronize incoming clock signals therebetween, wherein the synchronization circuitry comprises a delay locked loop, the delay locked loop comprising:
a delay line having a plurality of delay elements and a plurality of shift bits in a shift bit register, each shift bit operatively connected to one of the plurality of delay elements to toggle each shift bit as a rising edge of a clock signal passes therethrough;
an input clock buffer to receive an input clock signal;
a normally open signal gate connected to an output of the input clock buffer to detect an edge of a first clock signal and an edge of a second clock signal and to pass the first and the second clock signals to the delay line;
a phase detector connected to an output of the delay line to detect the edge of the first clock signal; and
shift bit logic connected between the phase detector and the shift bit register to prevent toggling of shift bits upon detection of the edge of the first clock signal at the output of the delay line.

16. The memory device of claim 15, and further comprising:
shift logic for setting the delay elements according to the shift bit status.

17. The memory device of claim 15, and further comprising:
dummy circuitry interposed between the end of the delay line and the phase detector.

18. An SDRAM, comprising:
a plurality of memory arrays addressed by row and column address decoders;
a memory controller operable to control read and write operations of the memory arrays;
synchronization circuitry operatively connected to the plurality of memory arrays to synchronize incoming clock signals, wherein the synchronization circuitry comprises a delay locked loop, the delay locked loop comprising:
a delay line having a plurality of delay elements and a plurality of shift bits in a shift bit register, each shift bit operatively connected to one of the plurality of delay elements to toggle each shift bit on a rising edge of a clock signal;
an input clock buffer to receive an input clock signal;
a normally open signal gate connected to an output of the input clock buffer to detect a rising edge of a first clock signal and a rising edge of a second clock signal and to pass the first and the second rising edges to the delay line;
a phase detector connected to an output of the delay line to detect the rising edge of the first clock signal; and
shift bit logic connected between the phase detector and the shift bit register to prevent toggling of shift bits upon detection of the edge of the first clock signal at the output of the delay line.

19. The SDRAM of claim 18, and further comprising:
shift logic for setting the delay elements according to shift bit status.

20. The SDRAM of claim 18, and further comprising:
dummy circuitry interposed between the output of the delay line and the phase detector.

21. An SDRAM, comprising:
a plurality of memory arrays addressed by row and column address decoders;
a memory controller operable to control read and write operations of the memory arrays;
synchronization circuitry operatively connected to the plurality of memory arrays to synchronize the incoming clock signal, wherein the synchronization circuitry comprises a delay locked loop, the delay locked loop comprising:
a delay line having a plurality of delay elements and a plurality of shift bits in a shift bit register, each shift bit operatively connected to one of the plurality of delay elements to toggle each shift bit in response to a rising edge of a clock signal;
delay line circuitry to pass two consecutive rising clock signal edges to the delay line; and
edge detection circuitry at an output end of the delay line to halt toggling of the shift bits upon detection of the first edge at the output end of the delay line.

22. The SDRAM of claim 21, and further comprising:
register address circuitry to determine a location in the shift register of a transition between shift bits having a binary one value and shift bits having a binary zero value.

23. The SDRAM of claim 22, and further comprising:
clock synchronization circuitry to begin clock synchronization at the determined transition.

24. The SDRAM of claim 21, and further comprising:
dummy circuitry interposed between the output end of the delay line and the edge detection circuitry.

25. The SDRAM of claim 21, wherein the edge detection circuitry is a phase detector.

26. An SDRAM, comprising:
a plurality of memory arrays addressed by row and column address decoders;
a memory controller operable to control read and write operations of the memory arrays;
synchronization circuitry operatively connected to the plurality of memory arrays to synchronize the incoming clock signal, wherein the synchronization circuitry comprises a delay locked loop, the delay locked loop comprising:
an adjustable delay chain having a plurality of delays and a plurality of shift bits, each shift bit corresponding to one of the plurality of delays, each shift bit operable in a first state and a second state, wherein the states are toggled by a clock signal edge passing through its respective delay;
an edge detection circuit connected to an input of the delay line to pass two clock edges to the delay line;
a phase detector connected to an output of the delay line to detect when the first clock signal reaches the output of the delay line; and
shift bit logic connected between the phase detector and the shift bits to halt the toggling of shift bits when the first clock signal reaches the output of the delay line.

* * * * *